US011257919B2

United States Patent
Knaipp

(10) Patent No.: US 11,257,919 B2
(45) Date of Patent: Feb. 22, 2022

(54) SCHOTTKY BARRIER DIODE WITH IMPROVED SCHOTTKY CONTACT FOR HIGH VOLTAGES

(71) Applicant: ams AG, Premstaetten (AT)

(72) Inventor: Martin Knaipp, Premstaetten (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/650,216

(22) PCT Filed: Sep. 24, 2018

(86) PCT No.: PCT/EP2018/075773
§ 371 (c)(1),
(2) Date: Mar. 24, 2020

(87) PCT Pub. No.: WO2019/063472
PCT Pub. Date: Apr. 4, 2019

(65) Prior Publication Data
US 2020/0235217 A1    Jul. 23, 2020

(30) Foreign Application Priority Data
Sep. 26, 2017 (EP) .................... 17193246

(51) Int. Cl.
*H01L 29/47* (2006.01)
*H01L 29/06* (2006.01)
(Continued)

(52) U.S. Cl.
CPC ............ *H01L 29/47* (2013.01); *H01L 29/063* (2013.01); *H01L 29/402* (2013.01); *H01L 29/872* (2013.01)

(58) Field of Classification Search
CPC . H01L 29/063; H01L 29/402; H01L 29/0692; H01L 29/0649;
(Continued)

(56) References Cited

U.S. PATENT DOCUMENTS 5,751,022 A * 5/1998 Yasuhara ............ H01L 29/7412
257/133
8,786,362 B1 7/2014 Lin et al.
(Continued)

FOREIGN PATENT DOCUMENTS

CN       101764131        6/2010

OTHER PUBLICATIONS

European Patent Office, International Search Report for PCT/EP2018/075773 dated Nov. 21, 2018.
(Continued)

*Primary Examiner* — Shahed Ahmed
(74) *Attorney, Agent, or Firm* — MH2 Technology Law Group LLP

(57) ABSTRACT

The Schottky barrier diode comprises a semiconductor body with a main surface, a doped region and a further doped region of the semiconductor body, which extend to the main surface, the doped region and the further doped region having opposite types of electric conductivity, a subregion and a further subregion of the further doped region, the subregions being contiguous with one another, the further subregion comprising a higher doping concentration than the subregion, a silicide layer on the main surface, the silicide layer forming an interface with the doped region, an electric contact on the doped region, and a further electric contact electrically connecting the further doped region with the silicide layer.

16 Claims, 2 Drawing Sheets

(51) Int. Cl.
*H01L 29/40* (2006.01)
*H01L 29/872* (2006.01)

(58) Field of Classification Search
CPC ..... H01L 2924/12032; H01L 29/66143; H01L 29/66212; H01L 27/0766; H01L 29/872–8725; H01L 51/0579; H01L 29/66848–66886; H01L 29/812–8128; H01L 29/47–475
See application file for complete search history.

(56) References Cited

U.S. PATENT DOCUMENTS

| | | | | |
|---|---|---|---|---|
| 8,823,139 | B2* | 9/2014 | Lee | H01L 27/0255 |
| | | | | 257/547 |
| 2003/0132450 | A1* | 7/2003 | Minato | H01L 29/0834 |
| | | | | 257/110 |
| 2006/0001057 | A1 | 1/2006 | Khemka et al. | |
| 2009/0267110 | A1 | 10/2009 | Cai | |
| 2009/0294865 | A1 | 12/2009 | Tang et al. | |
| 2012/0211859 | A1 | 8/2012 | Stribley et al. | |
| 2013/0062723 | A1* | 3/2013 | Henning | H01L 29/8611 |
| | | | | 257/484 |
| 2013/0069157 | A1* | 3/2013 | Tsuchiko | H01L 27/0814 |
| | | | | 257/337 |
| 2013/0181328 | A1* | 7/2013 | Cao | H01L 29/0657 |
| | | | | 257/618 |
| 2015/0236012 | A1* | 8/2015 | Hino | H01L 29/0878 |
| | | | | 257/77 |

OTHER PUBLICATIONS

Li, F. et al.: "Study of a novel lateral RESURF 3C-SiC on Si Shottky diode" 2014 16th European Conference on Power Electronics and Applications, IEEE, Aug. 26, 2014, pp. 1-10.
Sunkavalli, R. et al.: "Dielectrically Isolated Lateral Merged PiN Schottky (LMPS) Diodes" IEEE Transactions on Electron Devices, vol. 44, No. 11, Nov. 1997, pp. 2011-2016.
Office Action issued in European Application No. 17193246.0 dated Feb. 5, 2020, 6 pages.

* cited by examiner

SCHOTTKY BARRIER DIODE WITH IMPROVED SCHOTTKY CONTACT FOR HIGH VOLTAGES

The present disclosure applies to the field of Schottky barrier diodes, especially to the field of high-voltage Schottky barrier diodes.

BACKGROUND OF THE INVENTION

A Schottky barrier diode comprises an interface between metal and moderately doped semiconductor material, a so-called Schottky contact, which conducts primarily in one direction. A Schottky barrier diode starts conducting a significant current in the forward direction more quickly than a p-n junction diode. This feature is important to avoid malfunction of integrated circuits where a current is to be injected into an n-well, but not into the substrate.

In the following, the interface between the semiconductor material and the metal forming the Schottky contact will be referred to as "interface".

A high-voltage Schottky barrier diode requires a limitation of the electric field at the interface. Higher breakdown voltages can be achieved by highly doped regions at the surface of the semiconductor material close to the interface. The purpose of the highly doped regions is to build up a space charge region below the interface, in order to push the electric potential towards the cathode. In the manufacturing process, a dedicated mask is required to shield the interface during the implantation of the highly doped regions.

SUMMARY OF THE INVENTION

The definitions as described above also apply to the following description unless stated otherwise.

The Schottky barrier diode comprises a semiconductor body with a main surface, a doped region and a further doped region of the semiconductor body, which have opposite types of electric conductivity and both extend to the main surface, a subregion and a further subregion of the further doped region, the subregions being contiguous with one another, the further subregion comprising a higher doping concentration than the subregion, a silicide layer on the main surface, the silicide layer forming an interface with the doped region, an electric contact on the doped region, and a further electric contact electrically connecting the further doped region with the silicide layer. In a high-voltage Schottky barrier diode, the blocking voltage may be at least 10 V.

An embodiment of the Schottky barrier diode comprises an insulating region at the main surface between the electric contact and the further electric contact, and a field plate on the insulating region, the insulating region separating the field plate from the further doped region, and the electric contact electrically connecting the doped region with the field plate.

In a further embodiment, the field plate is arranged above the subregion.

In a further embodiment, the field plate does not cover the further subregion.

In a further embodiment, the doped region has n-type conductivity, and the further doped region has p-type conductivity.

In a further embodiment, the silicide layer covers an area of the further subregion where the doping concentration is at least $10^{16}$ cm$^{-3}$.

In a further embodiment, the subregion provides a reduced surface field condition.

In a further embodiment, the further subregion provides a voltage blocking capability protecting the interface against high electric fields.

In a further embodiment, the electric contact comprises a plurality of contact plugs, which are arranged on a straight line, and the further electric contact comprises a further plurality of contact plugs, which are arranged on a further straight line parallel to the straight line.

In a further embodiment, the further subregion has a shape of a ring or frame surrounding a portion of the doped region.

In a further embodiment, the portion of the doped region that is surrounded by the further subregion tapers at two opposite ends remote from each other.

In a further embodiment, the portion of the doped region that is surrounded by the further subregion is limited by a boundary to the further subregion, and the boundary has a hexagonal shape.

BRIEF DESCRIPTION OF THE DRAWINGS

The following is a detailed description of examples of the Schottky barrier diode in conjunction with the appended figures.

DETAILED DESCRIPTION

Figure 1:
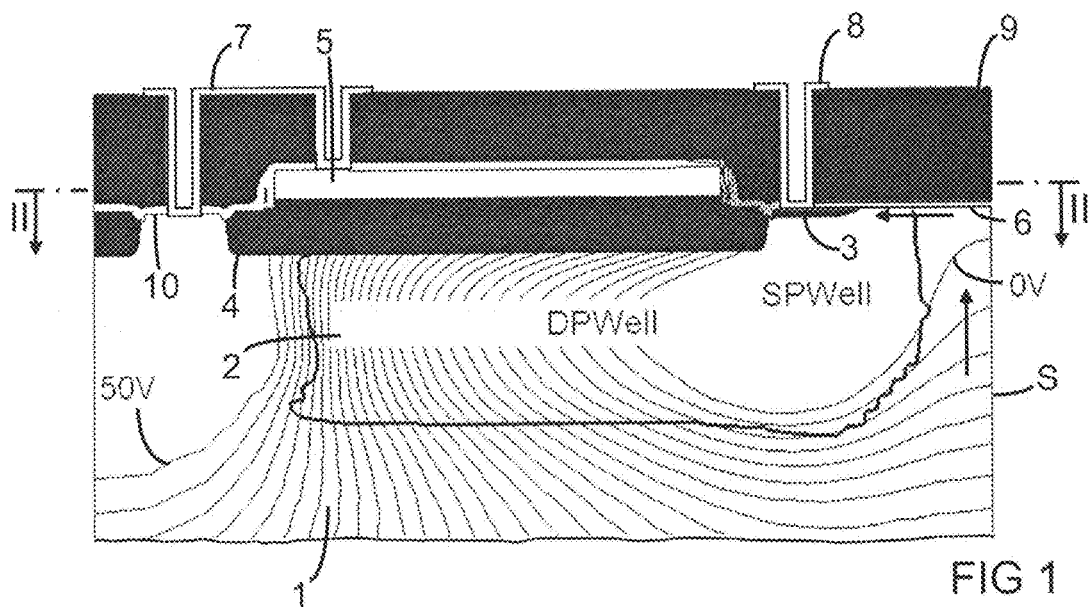
FIG. 1 is a partial cross section of an embodiment of the Schottky barrier diode.

FIG. 1 is a cross section of an embodiment of the Schottky barrier diode. It is formed in a semiconductor body, which may especially comprise silicon, for instance. A doped region 1 of a first type of conductivity, which may be n-type conductivity, for instance, is arranged under a main surface 10 of the semiconductor body. The doped region 1 may especially be formed by implanting a well in the semiconductor body, and may in particular be a deep diffused n-well formed in a p-type semiconductor substrate, for instance. A further doped region 2 of a second type of conductivity, which is opposite to the first type of conductivity and may be p-type conductivity, for instance, is formed within the doped region 1.

The further doped region 2 comprises a subregion DPWell and a further subregion SPWell, which are contiguous with one another. The doping concentration of the further subregion SPWell is higher than the doping concentration of the subregion DPWell. In particular, the subregion DPWell may be formed by implanting a deep well, especially a deep p-well, and the further subregion SPWell may be formed by implanting a shallow well, especially a shallow p-well. A contact region 3 having a doping concentration for the second type of conductivity that is higher than the doping concentration of the further subregion SPWell is optionally formed in the further subregion SPWell at the main surface 10 of the semiconductor body.

An insulating region 4 is arranged at the main surface 10 on the further doped region 2. A field plate 5 is arranged on the insulating region 4, in particular above the subregion DPWell. Thus the field plate 5 is separated from the further doped region 2 by the insulating region 4. The field plate 5 may especially comprise polysilicon, for instance.

A silicide layer 6 is applied on areas of the main surface 10 outside the insulating region 4, i. e. on active areas of the device. The silicide layer 6 is especially present on the doped region 1, as depicted on the right side of the cross section shown in FIG. 1. The silicide layer 6 and the semiconductor material of the semiconductor body form the interface. An essential portion of the interface is located on the doped region 1 outside the further doped region 2.

An electric contact 7 is applied on the doped region 1. If the doped region 1 is n-type, the electric contact 7 is the cathode contact. The electric contact 7 electrically connects the doped region 1 and the field plate 5. A further electric contact 8 is applied on the contact region 3 of the further subregion SPWell of the further doped region 2. If the further doped region 2 is p-type, the further electric contact 8 is the anode contact. The electric contact 7 and the further electric contact 8 can be formed in a dielectric layer 9, which may be applied on or above the main surface 10 and may comprise further elements of a wiring or the like.

The Schottky barrier diode may be symmetrical with respect to a plane of symmetry S, which is indicated in FIG. 1 by the vertical line limiting the cross-section on the right side. If the device is symmetrical, FIG. 1 shows a portion of the device that is on the left side in the direction of view. The dimensions of a symmetrical device are smaller than the dimensions of a non-symmetrical device, so that a symmetrical Schottky barrier diode may be more advantageous.

The interface is formed by the boundary between the silicide layer 6 and the semiconductor material, especially silicon. The subregion DPWell provides a reduced surface field (RESURF) condition and is arranged contiguous with and thus electrically connected to the further subregion SPWell, which functions as a buffer to protect the interface against high electric fields. The current through the Schottky barrier diode is conducted upwards through the doped region 1 towards the interface and laterally along the interface to the further electric contact 8, as indicated by arrows on the right side of FIG. 1.

The field plate facilitates depleting the subregion DPWell when the Schottky barrier diode is reverse biased. FIG. 1 shows equipotential lines for a reverse bias from a voltage of 50 V near the cathode (which is the electric contact 7 in this example) to a voltage of 0 V near the anode (which is the further electric contact 8 in this example).

Figure 2:
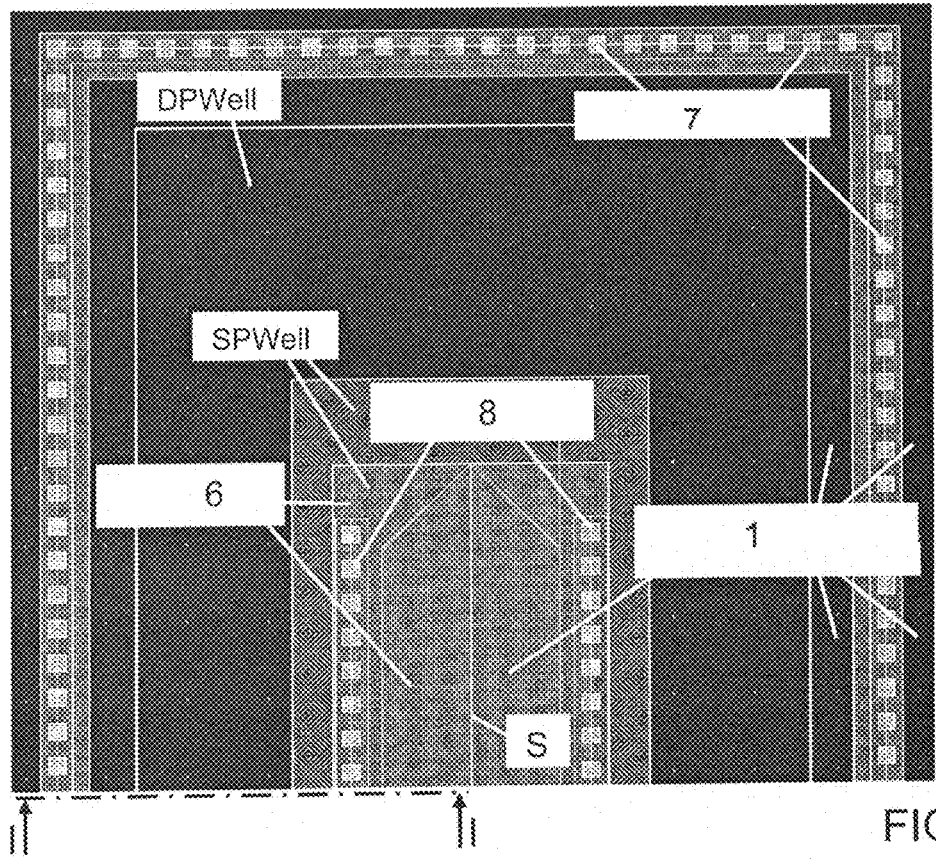
FIG. 2 shows a section of a top view of the Schottky barrier diode according to FIG. 1.

FIG. 2 shows a section of a top view of the Schottky barrier diode on the level indicated in FIG. 1 by broken horizontal lines. The position of the cross section of FIG. 1 is indicated in FIG. 2 by a further broken horizontal line at the bottom. The arrows indicate the direction of view. The top view shows one of the "head" regions of the device, i. e., one of two opposite regions remote from each other where cross sections that are parallel to the cross section of FIG. 1 and include the subregion DPWell do not include the further subregion SPWell.

The electric contact 7 is formed by a plurality of contact plugs in a framelike arrangement. The further electric contact 8 is formed by a further plurality of contact plugs, which may be arranged in sequences along straight lines running parallel to a central plane of symmetry S, and on both sides and at equal distances from the central plane of symmetry S. The sequences of contact plugs of the further electric contact 8 are interrupted at the "head" region.

FIG. 2 also shows the lateral limits of the doped regions and subregions. The subregion DPWell has a rectangular outer limit, the further subregion SPWell has a smaller rectangular outer limit within the subregion DPWell, and the silicide layer 6 has an even smaller rectangular outer limit within the further subregion SPWell. The idealized rectangular shapes are not realized by the actual manufacturing process. The circumference or outer limit of the further subregion SPWell is depicted as an oblong rectangle, which has a longitudinal extension parallel to the plane of symmetry S, and the "head" region includes one of the small sides of the rectangle.

The further subregion SPWell is excised in a central area, where only the doped region 1 is present. The further subregion SPWell has a shape of a ring or frame surrounding the portion of the doped region 1 that is located in the central area. FIG. 2 shows a portion of this central area, which may especially have a hexagonal shape with three pairs of parallel sides, one of the pairs running parallel to the plane of symmetry S. Towards the "head" region of the device, the central area tapers in the direction parallel to the plane of symmetry S to a vertex of the hexagon, where the distances between the interface and the electric contacts 7 are larger to help to avoid peaks of the electric field.

Figure 3:
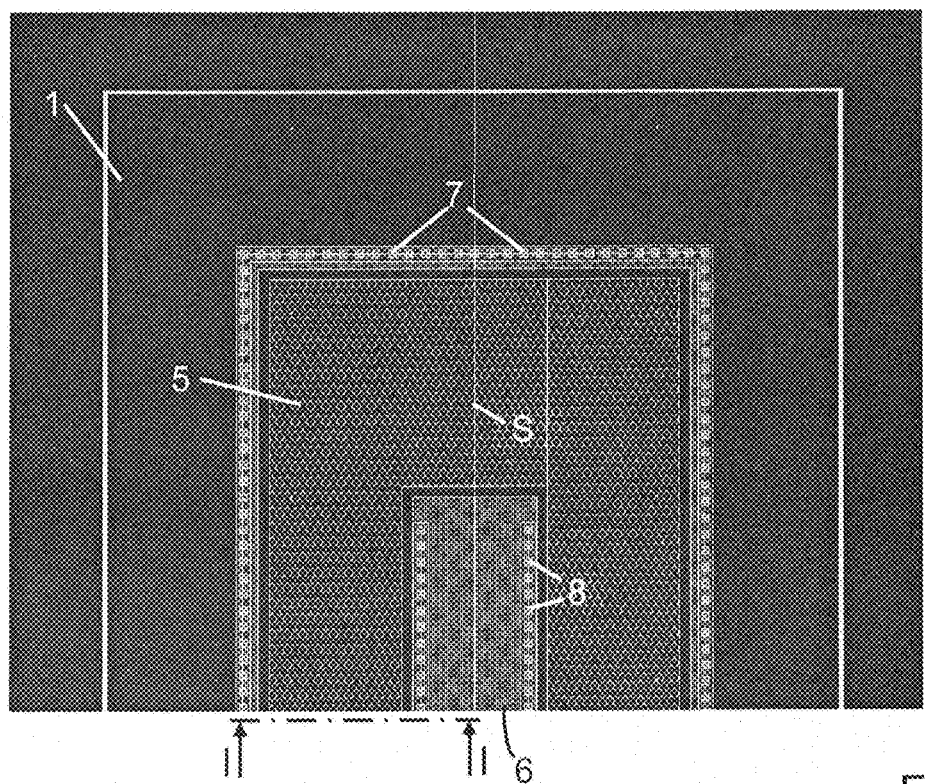
FIG. 3 shows a larger section of a top view of the Schottky barrier diode according to FIG. 1.

FIG. 3 shows a larger section of a top view of the Schottky barrier diode on the level indicated in FIG. 1. The position of the cross section of FIG. 1 is indicated in FIG. 3 by a further broken horizontal line at the bottom. The framelike arrangement of the contact plugs forming the electric contact 7 and the parallel arrangement of the contact plugs forming the further electric contact 8 are depicted according to FIG. 2, but a larger area of the doped region 1 is shown outside the framelike arrangement of the contact plugs. FIG. 3 shows a suitable shape of the field plate 5 surrounding the area of the silicide layer 6.

Figures 4, 5:
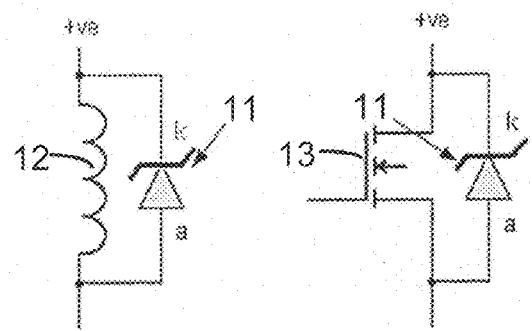
FIG. 4 is a diagram of a circuit including a Schottky barrier diode for protection against inductive loads.
FIG. 5 is a diagram of a circuit with a Schottky barrier diode for the protection of semiconductor devices.

FIG. 4 is a diagram of a circuit including a Schottky barrier diode for protection against inductive loads. The Schottky barrier diode 11, which may especially be a high-voltage Schottky barrier diode, is connected parallel to an inductor 12 as a freewheeling diode, which eliminates a sudden voltage spike that is generated across the inductor 12 when its current is interrupted.

FIG. 5 is a diagram of a circuit with a Schottky barrier diode for the protection of semiconductor devices. The Schottky barrier diode 11 is connected parallel to the semiconductor device, which is a MOSFET 13 in the example shown in FIG. 5, as a freewheeling diode, which protects the semiconductor device from high currents and voltage spikes that may be generated by induction.

The important property of a high-voltage Schottky barrier diode is to have a low leakage current for reverse bias in combination with a low on-resistance for forward bias. To protect the interface against high electric fields, an efficient voltage blocking capability is needed, which is provided by the highly doped further subregion SPWell. The purpose of the further subregion SPWell in the reverse direction is to build up a space charge region in the doped region 1, which pushes the potential towards the electric contact 7 (the cathode in the examples described above). As a result, the further subregion SPWell is not depleted during the blocking condition. To overcome the huge potential drop, a lower doped well is needed, which fulfills the RESURF condition. This is provided by the subregion DPWell, which is depleted from the top by the field plate 5. The advantage of this concept is that the potential drop in reverse direction takes place within a short distance, so that the size of the device can be kept small. A short cathode-anode length reduces the on-resistance in forward direction.

The invention claimed is:

1. A Schottky barrier diode, comprising:
a semiconductor body with a main surface,
a doped region of the semiconductor body, the doped region extending to the main surface,
a further doped region of the semiconductor body, the further doped region extending to the main surface, the doped region and the further doped region having opposite types of electric conductivity,
a subregion and a further subregion of the further doped region, the subregions being contiguous with one another, the further subregion comprising a higher doping concentration than the subregion,
a silicide layer on the main surface, the silicide layer forming an interface with the doped region,
an electric contact on the doped region,
a further electric contact electrically connecting the further doped region with the silicide layer,
an insulating region at the main surface between the electric contact and the further electric contact, and
a field plate on the insulating region, the insulating region separating the field plate from the further doped region, and the electric contact electrically connecting the doped region with the field plate.

2. The Schottky barrier diode of claim 1, wherein the field plate is arranged above the subregion.

3. The Schottky barrier diode of claim 2, wherein the field plate does not cover the further subregion.

4. The Schottky barrier diode of claim 1, wherein the doped region has n-type conductivity, and the further doped region has p-type conductivity.

5. The Schottky barrier diode of claim 1, wherein the silicide layer covers an area of the further subregion where the doping concentration is at least $10^{16}$ cm$^{-3}$.

6. The Schottky barrier diode of claim 1, wherein the subregion provides a reduced surface field condition.

7. The Schottky barrier diode of claim 1, wherein the further subregion provides a voltage blocking capability protecting the interface against high electric fields.

8. The Schottky barrier diode of claim 1, wherein the electric contact comprises a plurality of contact plugs, which are arranged on a straight line, and the further electric contact comprises a further plurality of contact plugs, which are arranged on a further straight line parallel to the straight line.

9. The Schottky barrier diode of claim 1, wherein the blocking voltage is at least 10 V.

10. The Schottky barrier diode of claim 1, wherein the further subregion has a shape of a ring or frame surrounding a portion of the doped region.

11. The Schottky barrier diode of claim 10, wherein the portion of the doped region that is surrounded by the further subregion tapers at two opposite ends remote from each other.

12. The Schottky barrier diode of claim 9, wherein the portion of the doped region that is surrounded by the further subregion is limited by a boundary to the further subregion, the boundary having a hexagonal shape.

13. The Schottky barrier diode of claim 1, wherein the interface is a Schottky contact.

14. The Schottky barrier diode of claim 1, wherein the further doped region is formed within the doped region.

15. The Schottky barrier diode of claim 1, wherein the further subregion is located closer to the interface than the subregion.

16. A Schottky barrier diode, comprising:
a semiconductor body with a main surface,
a doped region of the semiconductor body, the doped region extending to the main surface,
a further doped region of the semiconductor body, the further doped region extending to the main surface, the doped region and the further doped region having opposite types of electric conductivity,
a subregion and a further subregion of the further doped region, the subregions being contiguous with one another, the further subregion comprising a higher doping concentration than the subregion,
a silicide layer on the main surface, the silicide layer forming an interface with the doped region,
an electric contact on the doped region,
a further electric contact electrically connecting the further doped region with the silicide layer, wherein the interface is a Schottky contact, the further doped region is formed within the doped region, and the further subregion is located closer to the interface than the subregion
an insulating region at the main surface between the electric contact and the further electric contact, and
a field plate on the insulating region, the insulating region separating the field plate from the further doped region, and the electric contact electrically connecting the doped region with the field plate.

* * * * *